United States Patent
Liu et al.

(10) Patent No.: US 7,270,894 B2
(45) Date of Patent: Sep. 18, 2007

(54) METAL COMPOUND-METAL MULTILAYER ELECTRODES FOR ORGANIC ELECTRONIC DEVICES

(75) Inventors: Jie Liu, Niskayuna, NY (US); Anil Raj Duggal, Niskayuna, NY (US); Christian Maria Anton Heller, Albany, NY (US); Larry Neil Lewis, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 476 days.

(21) Appl. No.: 10/874,099

(22) Filed: Jun. 22, 2004

(65) Prior Publication Data

US 2005/0282068 A1    Dec. 22, 2005

(51) Int. Cl.
    *H01M 4/00*    (2006.01)
(52) U.S. Cl. ............... 428/690; 428/917; 429/129; 429/209
(58) Field of Classification Search ......... 428/690, 428/917; 313/504, 506; 429/128, 209
    See application file for complete search history.

(56) References Cited

U.S. PATENT DOCUMENTS

| | | | |
|---|---|---|---|
| 5,776,622 A | 7/1998 | Hung et al. | 428/690 |
| 6,255,774 B1 * | 7/2001 | Pichler | 313/504 |
| 6,525,466 B1 | 2/2003 | Jabbour et al. | 315/504 |
| 6,849,869 B1 * | 2/2005 | O'Regan et al. | 257/40 |
| 7,012,368 B2 * | 3/2006 | Kim | 313/506 |

OTHER PUBLICATIONS

L. S. Hung et al. "Enhanced Electron Injection In Organic Electroluminescence Devices Using An Al/LiF Electrode", Applied Physics Letters, vol. 70, pp. 152-154, 1997.
H. Tang et al., "Bright High Efficiency Blue Organic Light-Emitting Diodes With $Al_2O_3/Al$ Cathodes", Applied Physics Letters, vol. 71, pp. 2560-2562, 1997.
S. E. Shaheen et al., "Bright Blue Organic Light-Emitting Diode With Improved Color Purity Using a LiF/Al Cathode", Journal of Applied Physics, vol. 84. pp. 2324-2327, 1998.
Q.F. Xu et al., "Ultrahigh Efficiency Green Polymer Light-Emitting Diodes By Nanoscale Interface Modification", Applied Physics Letters, vol. 83, pp. 4695-4697, 2003.
Patent Application 132096, U.S. Appl. No. 10/662,083, filed Sep. 15, 2003.

* cited by examiner

*Primary Examiner*—Rena Dye
*Assistant Examiner*—Camie S. Thompson
(74) *Attorney, Agent, or Firm*—Mary Louise Gioeni; William E. Powell, III

(57) ABSTRACT

The invention provides an organic electronic device comprising: (i) a multilayer cathode comprising: (a) a conductive layer that is electrically connected as a bus, (b) a layer comprising at least one source of alkali metal ions, alkaline earth metal ions, or lanthanide ions and (c) a conductive metal layer comprising at least one conductive metal species; (ii) at least one electro-active organic layer; and (iii) an anode that is electrically connected to the conductive metal layer.

57 Claims, 2 Drawing Sheets

Fig. 1

| 10 |
|---|
| 16 |
| 14 |
| 12 |

Fig. 2

| 10 |
|---|
| 16 |
| 15 |
| 12 |

Fig. 3

| 10 |
|---|
| 16 |
| 15 |
| 14 |
| 12 |

Fig. 4

| 10 |
|---|
| 16 |
| 15 |
| 14 |

METAL COMPOUND-METAL MULTILAYER ELECTRODES FOR ORGANIC ELECTRONIC DEVICES

BACKGROUND OF THE INVENTION

The invention relates to an organic electronic device. More particularly, the invention relates to metal compound-metal multilayer electrodes for organic electronic devices.

Efficient operation of organic electronic devices depends, among other factors, on efficient transport of electronic charges between an electrode and an adjacent medium. Organic electronic devices are used in several applications based on converting electricity into light and/or light into electricity. Exemplary electro-active devices, classified as either organic or inorganic devices, are well known in graphic display and imaging art. Electro-active devices have been produced in different shapes and sizes for many applications. Inorganic electro-active devices, however, typically suffer from a required high activation voltage and low brightness. On the other hand, organic electro-active devices, that have been developed more recently, offer the benefits of a lower activation voltage and higher brightness in addition to simple manufacture, and, thus, the promise of more widespread applications.

An organic electronic device is typically a thin film structure formed on a substrate such as glass or transparent plastic. An electro-active layer and optional adjacent organic semiconductor layers are sandwiched between a cathode and an anode. The organic semiconductor layers may be either hole (positive charge)-injecting or electron (negative charge)-injecting layers and also comprise organic materials. The electro-active organic layer may itself consist of multiple sublayers, each comprising a different electro-active organic material.

Reducing or eliminating barriers for charge mobility between electro-active organic layers and an electrode contributes greatly to enhancing the efficiency of an organic electronic device. Metals having low work functions, such as the alkali and alkaline-earth metals, are often used in a cathode material to promote electron injection. However, these metals are susceptible to degradation upon exposure to the environment. Therefore, devices using these metals as cathode materials require rigorous encapsulation. In addition, these metals can diffuse rapidly into an adjacent electro-active organic layer, leading to device performance decay.

It is hence desirable to provide for greater charge mobility between electro-active organic layers and the electrodes. Electro-luminescent and other electro-active devices, such as photovoltaic cells, can also benefit from a lower barrier for electron transport across the interface between an active layer and an adjacent cathode. Therefore, it is desirable to provide a cathode assembly and materials that efficiently allow charges to move more readily between an electrode and an adjacent layer.

SUMMARY OF THE INVENTION

The present invention meets these and other needs by providing a multilayer cathode comprising: (i) a conductive layer, the conductive layer being electrically connected as a bus; (ii) a layer comprising at least one source of alkali metal ions, alkaline earth metal ions, or lanthanide ions; and (iii) a conductive metal layer comprising at least one conductive metal species.

Another embodiment of the present invention provides an organic electronic device comprising: (i) a multilayer cathode comprising: (a) a conductive layer that is electrically connected as a bus, (b) a layer comprising at least one source of alkali metal ions, alkaline earth metal ions, or lanthanide ions and (c) a conductive metal layer comprising at least one conductive metal species; (ii) at least one electro-active organic layer; and (iii) an anode that is electrically connected to the conductive metal layer.

These and other aspects, advantages, and salient features of the present invention will become apparent from the following detailed description, the accompanying drawings, and the appended claims.

BRIEF DESCRIPTION OF THE DRAWINGS

FIG. 1 is a schematic representation of one embodiment of the multilayer cathode according to the present invention;

FIG. 2 is a schematic representation of another embodiment of the multilayer cathode according to the present invention;

FIG. 3 is a schematic representation of a third embodiment of the multilayer cathode according to the present invention;

FIG. 4 is a schematic representation of a fourth embodiment of the multilayer cathode according to the present invention;

DETAILED DESCRIPTION OF THE INVENTION

Figure 5:
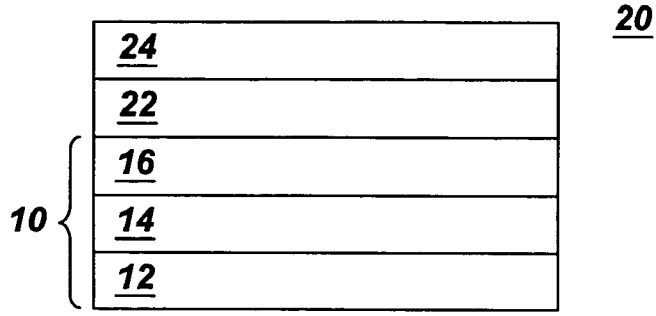
FIG. 5 is a schematic representation of one embodiment of the organic electronic device according to the present invention.

Typical organic electronic devices, for example organic electro-active devices, comprise (a) an anode, (b) a cathode, (c) an electro-luminescent organic layer disposed between the anode and the cathode, and (d) an electron transfer-promoting layer disposed between the cathode and the electro-luminescent organic layer. The electron transfer promoting layer may be at least one of an electron injection layer, a hole blocking layer, or a combination thereof.

An organic electro-luminescent material emits light when a voltage is applied across the anode and the cathode. An electron transfer-promoting material can form a distinct interface with an organic electro-active material or a provide a continuous transition region having a composition changing from substantially pure electron transfer promoting material to substantially pure organic electro-active material. An electron injection layer may be deposited on an underlying material by a method selected from the group consisting of spin coating, spray coating, dip coating, roller coating, or ink-jet printing.

The cathode is designed to inject negative charge carriers (electrons) into an electro-active organic layer and is made of a material having a low work function; e.g., less than about 4 eV. Low-work function materials suitable for use as a cathode are K, Li, Na, Mg, Ca, Sr, Ba, Al, Ag, In, Sn, Zn, Zr, Sc, Y, elements of the lanthanide series, alloys thereof, or mixtures thereof. Suitable alloy materials for the manufacture of a cathode layer are Ag—Mg, Al—Li, In—Mg, and Al—Ca alloys. Layered non-alloy structures are also possible, such as a thin layer of a metal such as Ca (thickness from about 1 to about 10 nm) or a non-metal such as LiF, covered by a thicker layer of some other metal, such as aluminum or calcium. The cathode may be deposited on the underlying element by physical vapor deposition, chemical vapor deposition, or sputtering. Novel electron-donating materials that lower the work function of cathode, thus reducing the barrier for electron injection and/or transport into the electro-luminescent organic layer have also been developed. One embodiment of the present invention provides a multilayer cathode comprising a plurality of cathode component layers. In another embodiment, the cathode is a bilayer cathode. In a third embodiment, the cathode is a trilayer cathode.

Referring to the drawings in general and to FIG. 1 in particular, it will be understood that the illustrations are for the purpose of describing a preferred embodiment of the invention and are not intended to limit the invention thereto.

In one aspect of the present invention shown in FIG. 1, the invention provides a multilayer cathode 10 comprising: (i) a conductive layer 12 that is electrically connected as a bus; (ii) a layer 14 comprising at least one source of alkali metal ions, alkaline earth metal ions, or lanthanide ions; and (iii) a conductive metal layer 16 comprising at least one conductive metal species.

A bus, sometimes referred to as an interface bus, is an electronic device that improves the electrical conductivity (or electron transfer bandwidth) between two interfacing electronic elements. An interface bus may improve conductivity along linear or planar dimensions. Since a multilayer cathode comprises thin metal and metal compound layers, the in-plane conductivity of the multilayer cathode is enhanced by the presence of a bus.

The source of alkali metal ions, alkaline earth metal ions, or lanthanide ions has the formula:

wherein M is independently at each occurrence an alkali metal ion, an alkaline earth metal ion, or a lanthanide metal ion, and X is independently at each occurrence an anion selected from the group consisting of hydroxide, oxide, sulfide, selenide, telluride, sulfite, bisulfite, sulfate, bisulfate, phosphite, hydrogenphosphite, phosphate, hydrogenphosphate, nitrate, nitrite, perchlorate, perchlorite, $BF_4^-$, $PF_6^-$, phosphonate, sulfonate, boronate, carbonate, bicarbonate, and organic carboxylate, and n and m are independently integers from 1 to about 20.

In one embodiment of the present invention, conductive layer 12 comprises at least one of indium-tin oxide, gold, silver, aluminum, platinum, chromium, palladium, or a combination thereof. In another embodiment, conductive metal layer 16 comprises at least one of aluminum, calcium, magnesium, palladium, platinum, silver, gold, mercury, cobalt, copper, nickel, gallium, carbon, or a combination thereof.

In a second aspect of the present invention shown in FIG. 2, layer 14 further comprises at least one conductive metal 15, that is the same or different as the conductive metal species of layer 16.

In a third aspect of the present invention shown in FIG. 3, multilayer cathode 10 further comprises a layer 15 comprising at least one source of alkali metal ions, alkaline earth metal ions, or lanthanide ions, and at least one conductive metal, the conductive metal being the same or different as the conductive metal species of layer 16.

In a fourth aspect of the present invention shown in FIG. 4, a multilayer cathode 10 comprises a layer 14 comprising at least one source of alkali metal ions, alkaline earth metal ions, or lanthanide ions; a conductive metal layer 16 comprising at least one conductive metal species; and a layer 15 comprising at least one source of alkali metal ions, alkaline earth metal ions, or lanthanide ions, and at least one conductive metal, the conductive metal being the same or different as the conductive metal species of layer 16.

In a fifth aspect of the present invention shown in FIG. 5, the invention provides an organic electronic device 20 such as an organic transistor (FET) or a sensor. The organic electronic device 20 comprises: (i) a multilayer cathode 10 comprising: (a) a conductive layer 12 that is electrically connected as a bus, (b) a layer 14 comprising at least one source of alkali metal ions, alkaline earth metal ions, or lanthanide ions, and (c) a conductive metal layer 16 comprising at least one conductive metal species; (ii) at least one electro-active organic layer 22 and (iii) an anode 24 that is electrically connected to the conductive metal layer.

In one embodiment, the electro-active organic layer 22 is light absorbing. In another embodiment, the electro-active organic layer 22 is light emitting. In a third embodiment, the organic electronic device 20 comprises a substrate 26. In one embodiment, substrate 26 is positioned at one end of the device. In another embodiment, substrate 26 is positioned at both ends of the device. In one embodiment, substrate 26 comprises at least one of a ceramic, a glass, a composite, a plastic, or a combination thereof. In one embodiment, substrate 26 comprises a polycarbonate, a polyester, or a combination thereof.

The anode 24 of the present invention comprises a material having a high work function; e.g., greater than about 4.4 eV, for example from about 5 eV to about 7 eV. Indium tin oxide ("ITO") is typically used for this purpose. ITO is substantially transparent to light transmission and allows light emitted from electro-active organic layer 22 to propagate through the ITO anode layer without being seriously attenuated. The term "substantially transparent" implies allowing at least 50 percent, preferably at least 80 percent, and more preferably at least 90 percent, of light in the visible wavelength range transmitted through a film having a thickness of about 0.5 micrometer, at an incident angle of less than or equal to 10 degrees. Other materials suitable for use as the anode layer are tin oxide, indium oxide, zinc oxide, indium zinc oxide, zinc indium tin oxide, antimony oxide, and mixtures thereof. The anode layer may be deposited on the underlying element by physical vapor deposition, chemical vapor deposition, or sputtering. The thickness of an anode comprising such an electrically conducting oxide can be in the range from about 10 nm to about 500 nm, preferably from about 10 nm to about 200 nm, and more preferably from about 50 nm to about 200 nm. A thin, substantially transparent layer of a metal is also suitable; for example, a layer having a thickness less than about 50 nm, preferably less than about 20 nm. Suitable metals for the anode 24 are those having high work function, such as greater than about 4.4 eV, for example, silver, copper, tungsten, nickel, cobalt, iron, selenium, germanium, gold, platinum, aluminum, chromium, palladium, or mixtures thereof or alloys thereof. In one embodiment, it may be desirable to dispose the anode on a substantially transparent substrate, such as one comprising glass or a polymeric material.

In one embodiment, the organic electronic device 20 further comprises a hole injection layer 28 positioned between the anode 24 and the electro-active organic layer 22. In another embodiment of the present invention, the organic electronic device 20 further comprises an electron injection layer 30 positioned between the electro-active organic layer 22 and the conductive metal layer 16.

The hole injection layer 28 has the function of transporting holes and blocking the transportation of electrons so that holes and electrons are optimally combined in the electro-active organic layer 22. Materials suitable for the hole injection layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371. In a preferred embodiment, the hole injection layer 28 comprises at least one of poly(3,4-ethylenedioxythiophene) or PEDOT, poly(3,4-propylenedioxythiophene) or PProDOT, or a combination thereof.

The electron injection layer 30 has the function of enhancing electronic transport to the electro-active organic layer 22. Materials suitable for the electron injection layer are metal organic complexes such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, as disclosed in U.S. Pat. No. 6,023,371.

The electro-active organic layer 22 of the present invention is selected from the group consisting of poly(n-vinylcarbazole) ("PVK"), polyfluorene, poly(alkylfluorene), poly(paraphenylene), poly(p-phenylene vinylene), polysilanes, polythiophene, poly(2,5-thienylene vinylene), poly(pyridine vinylene), polyquinoxaline, polyquinoline, 1,3,5-tris{n-(4-diphenylaminophenyl) phenylamino}benzene, phenylanthracene, tetraarylethene, coumarin, rubrene, tetraphenylbutadiene, anthracene, perylene, coronene, and derivatives thereof, aluminum-acetylacetonate, gallium-acetylacetonate, and indium-acetylacetonate, aluminum-(picolymethylketone)-bis{2,6-di(t-butyl)phenoxide}, scandium-(4-methoxy-picolylmethylketone)-bis(acetylacetonate), organo-metallic complexes of 8-hydroxyquinoline, and derivatives of organo-metalic complexes of 8-hydroxyquinoline, and combinations thereof.

The electro-active organic layer 22 serves as a transport media for both holes and electrons. In this layer the excited species combine and drop to a lower energy level, concurrently emitting electromagnetic radiation in the visible range. Organic electro-active materials are chosen to activate in the desired wavelength range. The thickness of the electro-active organic layer 22 is preferably kept in the range of about 100 to about 300 nm. The electro-active organic layer 22 may be a polymer, a copolymer, a mixture of polymers, or lower molecular-weight organic molecules having unsaturated bonds. Such materials possess a delocalized $\pi$-electron system, which gives the polymer chains or organic molecules the ability to support positive and negative charge carriers with high mobility. Suitable electro-active polymers are poly(n-vinylcarbazole) ("PVK", emitting violet-to-blue light in the wavelengths of about 380-500 nm) and its derivatives; polyfluorene and its derivatives such as poly(alkylfluorene), for example poly(9,9-dihexylfluorene) (410-550 nm), poly(dioctylfluorene) (wavelength at peak EL emission of 436 nm) or poly{9,9-bis(3,6-dioxaheptyl)-fluorene-2,7-diyl} (400-550 nm); poly(praraphenylene) ("PPP") and its derivatives such as poly(2-decyloxy-1,4-phenylene) (400-550 nm) or poly(2,5-diheptyl-1,4-phenylene); poly(p-phenylene vinylene) ("PPV") and its derivatives such as dialkoxy-substituted PPV and cyano-substituted PPV; polythiophene and its derivatives such as poly(3-alkylthiophene), poly(4,4'-dialkyl-2,2'-biothiophene), poly(2,5-thienylene vinylene); poly(pyridine vinylene) and its derivatives; polyquinoxaline and its derivatives; and poly quinoline and its derivatives. Mixtures of these polymers or copolymers based on one or more of these polymers and others may be used to tune the color of emitted light.

More than one electro-active organic layers may also be formed successively one on top of another, each layer comprising a different electro-active organic material that emits in a different wavelength range. Such assembly facilitates a tuning of the color of the light emitted from the overall electro-active device.

Figure 6:
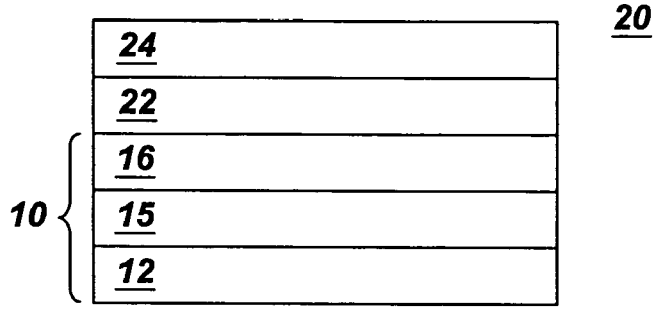
FIG. 6 is a schematic representation of another embodiment of the organic electronic device according to the present invention.

In a sixth aspect of the present organic electronic device 20 shown in FIG. 6, layer 14 further comprises at least one conductive metal 15, that is the same or different as the conductive metal species of layer 16.

Figure 7:
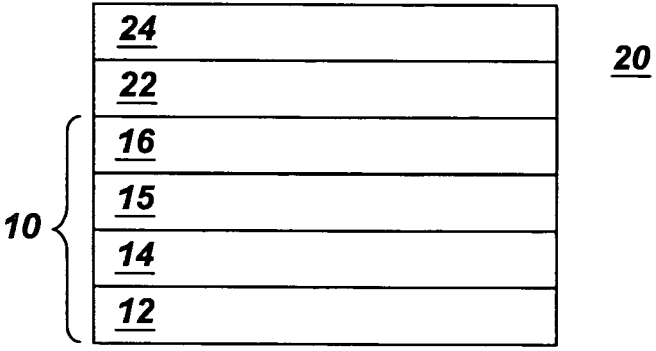
FIG. 7 is a schematic representation of a third embodiment of the organic electronic device according to the present invention.

In a seventh aspect of the present organic electronic device 20 shown in FIG. 7, multilayer cathode 10 further comprises a layer 15 comprising at least one source of alkali metal ions, alkaline earth metal ions, or lanthanide ions, and at least one conductive metal, the conductive metal being the same or different as the conductive metal species of layer 16.

Figure 8:
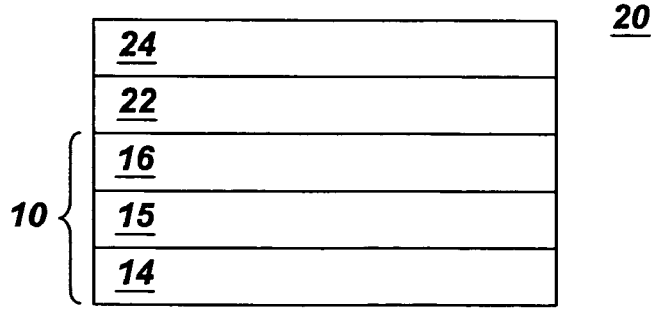
FIG. 8 is a schematic representation of a fourth embodiment of the organic electronic device according to the present invention.

In an eighth aspect of the present invention shown in FIG. 8, the organic electronic device 20 comprises: (i) a multilayer cathode 10 comprising: (a) a layer 14 comprising at least one source of alkali metal ions, alkaline earth metal ions, or lanthanide ions, (b) a conductive metal layer 16 comprising at least one conductive metal species, and (c) a layer 15 comprising at least one source of alkali metal ions, alkaline earth metal ions, or lanthanide ions, and at least one conductive metal, the conductive metal being the same as the conductive metal species of layer 16; (ii) at least one electro-active organic layer 22; and an anode 24 that is electrically connected to the conductive metal layer 16.

The following examples are included to illustrate the various features and advantages of the present invention, and are not intended to limit the invention.

EXAMPLE 1

Fabrication of Organic Electronic Device with Bilayer and Trilayer Cathodes

Two organic light emitting devices were fabricated in accordance with the following procedure. The devices were fabricated on glass substrates pre-coated with indium tin oxide (or ITO) (Applied Films). A layer, approximately 65 nm thick, of poly (3,4-ethylendioxythiophene/polystyrene sulfonate (PEDOT) (Bayer Corporation), was deposited onto ultraviolet-ozone treated ITO substrates via spin-coating. The layer was baked for 30 mins at 180° C. in air. PEDOT coated ITO substrates were transferred into a controlled-atmosphere glove box with moisture and oxygen presence of less than 1 ppm. A layer, approximately 70 nm thick of a blue light-emitting polymer (ADS329BE from American Dye Source, Inc, Quebec, Canada) was spin-coated on the PEDOT layer. Cathode materials were thermally-evaporated at a vacuum of $2 \times 10^{-6}$ torr. In one case, the cathode consists of 4 nm NaF followed by 100 nm Al to yield a bilayer cathode; in another instance the cathode consists of 4 nm NaF, followed by a mixture of NaF and Al in a ratio of 1:2 to a thickness of approximately 30 nm and subsequently capped with a 100 nm thick layer of Al to yield a trilayer cathode. The devices were encapsulated using a glass slide sealed with epoxy. The current-voltage characteristics of the organic light emitting devices were measured with a programmed Keithley 236 source measure unit. Brightness was measured with a Minolta luminance meter (model LS-110). The device with the trilayer cathode was found to demonstrate similar current-voltage characteristics as well as efficiency when compared to the device with the bilayer cathode. It was concluded that a stringent thickness control, necessary for a bilayer cathode, is not a requirement for a trilayer cathode. It was also concluded that for the compound and metal that form the bilayer and trilayer cathodes, the working mechanisms likely manifest as (i) the metal chemically reduces the compound (in the first layer and/or the mixture) and releases neutral Na, which dopes the organic materials, and (ii) the first compound layer also protects the underlying organic materials and reduces the likelihood of any damage caused by reactive metals such as aluminum.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A multilayer cathode comprising:
   (a) a conductive layer, said conductive layer being electrically connected as a bus;
   (b) a layer comprising at least one source of metal ions of formula $M_nX_m$; and
   (c) a conductive metal layer comprising at least one conductive metal species,
   wherein M is an alkali metal ion, an alkaline earth metal ion, a lanthanide metal ion, or a combination thereof;
   X is an anion selected from the group consisting of hydroxide, sulfide, selenide, telluride, sulfite, bisulfite, sulfate, bisulfate, phosphite, hydrogen phosphite, phosphate, hydrogen phosphate, nitrate, nitrite, perchlorate, perchlorite, $BF_4^-$, $PF_6^-$, phosphonate, sulfonate, boronate, carbonate, bicarbonate, and organic carboxylate, and
   n and m are independently integers from 1 to about 20.

2. The multilayer cathode according to claim 1, wherein said conductive layer (a) comprises at least one of indium-tin oxide, gold, silver, aluminum, platinum, chromium, palladium, or a combination thereof.

3. The multilayer cathode according to claim 1, wherein said conductive metal layer (c) comprises at least one of aluminum, calcium, magnesium, palladium, platinum, silver, gold, mercury, cobalt, copper, nickel, gallium, carbon, or a combination thereof.

4. The multilayer cathode according to claim 1 wherein said layer (b) comprises at least one source of alkali metal ions, alkaline earth metal ions, or lanthanide ions further comprises at least one conductive metal, said conductive metal being the same or different as the conductive metal species of layer (c).

5. The multilayer cathode according to claim 4, wherein said conductive layer (a) comprises at least one of indium-tin oxide, gold, silver, aluminum, platinum, chromium, palladium, or a combination thereof.

6. The multilayer cathode according to claim 4, wherein said conductive metal layer (c) comprises at least one of aluminum, calcium, magnesium, palladium, platinum, silver, gold, mercury, cobalt, copper, nickel, gallium, carbon, or a combination thereof.

7. The multilayer cathode according to claim 1 further comprising a layer (b'), said layer (b') comprising at least one source of alkali metal ions, alkaline earth metal ions, or lanthanide ions, and at least one conductive metal, said conductive metal being the same or different as the conductive metal species of layer (c).

8. The multilayer cathode according to claim 7, wherein said source of alkali metal ions, alkaline earth metal ions, or lanthanide ions comprising said layer (b'), has formula:

$$M_nX_m$$

wherein M is independently at each occurrence an alkali metal ion, an alkaline earth metal ion, or a lanthanide metal ion, and X is independently at each occurrence an anion selected from the group consisting of hydroxide, oxide, sulfide, selenide, telluride, sulfite, bisulfite, sulfate, bisulfate, phosphite, hydrogenphosphite, phosphate, hydrogenphosphate, nitrate, nitrite, perchlorate, perchlorite, $BF_4^-$, $PF_6^-$, phosphonate, sulfonate, boronate, carbonate, bicarbonate, and organic carboxylate, and n and m are independently integers from 1 to about 20.

9. The multilayer cathode according to claim 7, wherein said conductive layer (a) comprises at least one of indium-tin oxide, gold, silver, aluminum, platinum, chromium, palladium, or a combination thereof.

10. The multilayer cathode according to claim 7, wherein said conductive metal layer (c) comprises at least one of aluminum, palladium, platinum, silver, gold, mercury, cobalt, copper, nickel, gallium, carbon, or a combination thereof.

11. A multilayer cathode comprising:
    a layer (b) comprising at least one source of alkali metal ions, an alkaline earth metal ions, or lanthanide ions;
    a conductive metal layer (c) comprising at least one conductive metal species; and
    a layer (b') comprising at least one source of metal ions, and at least one conductive metal, said conductive metal being the same or different as the conductive metal species of layer (c), and said source of metal ions having formula $M_nX_m$;
    wherein M is an alkali metal ion, an alkaline earth metal ion, a lanthanide metal ion, or a combination thereof;
    X is an anion selected from the group consisting of hydroxide, sulfide, selenide, telluride, sulfite, bisulfite, sulfate, bisulfate, phosphite, hydrogen phosphite, phosphate, hydrogen phosphate, nitrate, nitrite, perchlorate, perchlorite, $BF_4^-$, $PF_6^-$, phosphonate, sulfonate, boronate, carbonate, bicarbonate, and organic carboxylate, and
    n and m are independently integers from 1 to about 20.

12. The multilayer cathode according to claim 11, wherein said conductive layer (a) comprises at least one of indium-tin oxide, gold, silver, aluminum, platinum, chromium, palladium, or a combination thereof.

13. The multilayer cathode according to claim 11, wherein said conductive metal layer (c) comprises at least one of aluminum, calcium, magnesium, palladium, platinum, silver, gold, mercury, cobalt, copper, nickel, gallium, carbon, or a combination thereof.

14. An organic electronic device comprising:
    (i) a multilayer cathode; said cathode comprising:
        (a) a conductive layer said conductive layer being electrically connected as a bus;

(b) a layer comprising at least one source of metal ions of formula; and (c) a conductive metal layer comprising at least one conductive metal species;

(ii) at least one electro-active organic layer; and (iii) an anode, said anode being electrically connected to the conductive metal layer;

wherein M is an alkali metal ion, an alkaline earth metal ion, a lanthanide metal ion, or a combination thereof;

X is an anion selected from the group consisting of hydroxide, sulfide, selenide, telluride, sulfite, bisulfite, sulfate, bisulfate, phosphite, hydrogen phosphite, phosphate, hydrogen phosphate, nitrate, nitrite, perchlorate, perchlorite, $BF_4^-$, $PF_6^-$, phosphonate, sulfonate, boronate, carbonate, bicarbonate, and organic carboxylate, and n and m are independently integers from 1 to about 20.

15. The organic electronic device according to claim 14, wherein said organic electronic device further comprises a substrate.

16. The organic electronic device according to claim 15, wherein said substrate comprises at least one of a ceramic, a glass, a composite, a plastic, or a combination thereof.

17. The organic electronic device according to claim 15 wherein said substrate comprises a polycarbonate, a polyester, or a combination thereof.

18. The organic electronic device according to claim 14, wherein said conductive layer (a) comprises at least one of indium-tin oxide, gold, silver, aluminum, platinum, chromium, palladium, or a combination thereof.

19. The organic electronic device according to claim 14, wherein said conductive metal layer (c) comprises at least one of aluminum, calcium, magnesium, palladium, platinum, silver, gold, mercury, cobalt, copper, nickel, gallium, carbon, or a combination thereof.

20. The organic electronic device according to claim 14, wherein said anode comprises at least one of indium-tin oxide, gold, silver, aluminum, platinum, chromium, palladium, or a combination thereof.

21. The organic electronic device according to claim 14, wherein said organic electronic device further comprises a hole injection layer positioned between said anode and said electro-active organic layer.

22. The organic electronic device according to claim 20, wherein said hole injection layer comprises at least one of poly(3,4-ethylenedioxythiophene), poly(3,4-propylenedioxythiophene), or a combination thereof.

23. The organic electronic device according to claim 14 wherein said electro-active layer is an electro-luminescent organic layer comprising at least one of poly(n-vinylcarbazole) and its derivatives, polyfluorene and its derivatives, poly(dioctylfluorene) and its derivatives, poly(paraphenylene) and its derivatives; poly(p-phenylene vinylene) and its derivatives, polythiophene and its derivatives; poly(pyridine vinylene) and its derivatives; polyquinoxaline and its derivatives; and poly quinoline and its derivatives, or a combination thereof.

24. The organic electronic device according to claim 14 further comprising an electron injection layer positioned between said electro-active organic layer and said conductive metal layer (c).

25. The organic electronic device according to claim 14 wherein said layer (b) comprising at least one source of alkali metal ions, alkaline earth metal ions, or lanthanide ions further comprises at least one conductive metal, said conductive metal being the same or different as the conductive metal species of layer (c).

26. The organic electronic device according to claim 25, wherein said organic electronic device further comprises a substrate.

27. The organic electronic device according to claim 26, wherein said substrate comprises at least one of a ceramic, a glass, a composite, a plastic, or a combination thereof.

28. The organic electronic device according to claim 26 wherein said substrate comprises a polycarbonate, a polyester, or a combination thereof.

29. The organic electronic device according to claim 25, wherein said conductive layer (a) comprises at least one of indium-tin oxide, gold, silver, aluminum, platinum, chromium, palladium, or a combination thereof.

30. The organic electronic device according to claim 25, wherein said conductive metal layer (c) comprises at least one of aluminum, calcium, magnesium, palladium, platinum, silver, gold, mercury, cobalt, copper, nickel, gallium, carbon, or a combination thereof.

31. The organic electronic device according to claim 25, wherein said anode comprises at least one of indium-tin oxide, gold, silver, aluminum, platinum, chromium, palladium, or a combination thereof.

32. The organic electronic device according to claim 25, wherein said organic electronic device further comprises a hole injection layer positioned between said anode and said electro-active organic layer.

33. The organic electronic device according to claim 32, wherein said hole injection layer comprises at least one of poly(3,4-ethylenedioxythiophene), poly(3,4-propylenedioxythiophene), or a combination thereof.

34. The organic electronic device according to claim 25 wherein said electro-active layer is an electro-luminescent organic layer comprising at least one of poly(n-vinylcarbazole) and its derivatives, polyfluorene and its derivatives, poly(dioctylfluorene) and its derivatives, poly(paraphenylene) and its derivatives; poly(p-phenylene vinylene) and its derivatives, polythiophene and its derivatives; poly(pyridine vinylene) and its derivatives; polyquinoxaline and its derivatives; and poly quinoline and its derivatives, or a combination thereof.

35. The organic electronic device according to claim 25 further comprising an electron injection layer positioned between said electro-active organic layer and said conductive metal layer (c).

36. The organic electronic device according to claim 14 wherein the multilayer cathode (i) further comprises a layer (b'), said layer (b') comprising at least one source of alkali metal ions, alkaline earth metal ions, or lanthanide ions, and at least one conductive metal, said conductive metal being the same or different as the conductive metal species of layer (c).

37. The organic electronic device according to claim 36, wherein said source of alkali metal ions, alkaline earth metal ions, or lanthanide ions comprising said layer (b'), has formula:

$$M_nX_m$$

wherein M is independently at each occurrence an alkali metal ion, an alkaline earth metal ion, or a lanthanide metal ion, and X is independently at each occurrence an anion selected from the group consisting of hydroxide, oxide, sulfide, selenide, telluride, sulfite, bisulfite, sulfate, bisulfate, phosphite, hydrogenphosphite, phosphate, hydrogenphosphate, nitrate, nitrite, perchlorate, perchlorite, $BF_4^-$, $PF_6^-$, phosphonate, sulfonate, boronate, carbonate bicarbonate, and organic carboxylate, and n and m are independently integers from 1 to about 20.

38. The organic electronic device according to claim 36, wherein said organic electronic device further comprises a substrate.

39. The organic electronic device according to claim 38, wherein said substrate comprises at least one of a ceramic, a glass, a composite, a plastic, or a combination thereof.

40. The organic electronic device according to claim 38 wherein said substrate comprises a polycarbonate, a polyester, or a combination thereof.

41. The organic electronic device according to claim 36, wherein said conductive layer (a) comprises at least one of indium-tin oxide, gold, silver, aluminum, platinum, chromium, palladium, or a combination thereof.

42. The organic electronic device according to claim 36, wherein said conductive metal layer (c) comprises at least one of aluminum, calcium, magnesium, palladium, platinum, silver, gold, mercury, cobalt, copper, nickel, gallium, carbon, or a combination thereof.

43. The organic electronic device according to claim 36, wherein said anode comprises at least one of indium-tin oxide, gold, silver, aluminum, platinum, chromium, palladium, or a combination thereof.

44. The organic electronic device according to claim 36, wherein said organic electronic device further comprises a hole injection layer positioned between said anode and said electro-active organic layer.

45. The organic electronic device according to claim 44, wherein said hole injection layer comprises at least one of poly(3,4-ethylenedioxythiophene), poly(3,4-propylenedioxythiophene), or a combination thereof.

46. The organic electronic device according to claim 36 wherein said electro-active layer is an electro-luminescent organic layer comprising at least one of poly(n-vinylcarbazole) and its derivatives, polyfluorene and its derivatives, poly(dioctylfluorene) and its derivatives, poly(paraphenylene) and its derivatives; poly(p-phenylene vinylene) and its derivatives, polythiophene and its derivatives; poly(pyridine vinylene) and its derivatives; polyquinoxaline and its derivatives; and poly quinoline and its derivatives, or a combination thereof.

47. The organic electronic device according to claim 36 further comprising an electron injection layer positioned between said electro-active organic layer and said conductive metal layer (c).

48. An organic electronic device comprising:
(i) a multilayer cathode; said cathode comprising:
(b) a layer comprising at least one source of alkali metal ions, an alkaline earth metal ions, or lanthanide ions;
(c) a conductive metal layer comprising at least one conductive metal species; and
(b') a layer comprising at least one source of alkali metal ions, alkaline earth metal ions, or lanthanide ions, and at least one conductive metal, said conductive metal being the same or different as the conductive metal species of layer (c);
(ii) at least one electro-active organic layer; and (iii) an anode, said anode being electrically connected to the conductive metal layers,
wherein said source of alkali metal ions, alkaline earth metal ions, or lanthanide ions present in layers (b) and (b') may be the same or different and has formula:

$M_nX_m$ wherein M is an alkali metal ion, an alkaline earth metal ion, a lanthanide metal ion, or a combination thereof;
X is an anion selected from the group consisting of hydroxide, sulfide, selenide, telluride, sulfite, bisulfite, sulfate, bisulfate, phosphite, hydrogen phosphite, phosphate, hydrogen phosphate, nitrate, nitrite, perchlorate, perchlorite, $BF_4^-$, $PF_6^-$, phosphonate, sulfonate, boronate, carbonate, bicarbonate, and organic carboxylate, and
n and m are independently integers from 1 to about 20.

49. The organic electronic device according to claim 48, wherein said organic electronic device further comprises a substrate.

50. The organic electronic device according to claim 49, wherein said substrate comprises at least one of a ceramic, a glass, a composite, a plastic, or a combination thereof.

51. The organic electronic device according to claim 49 wherein said substrate comprises a polycarbonate, a polyester, or a combination thereof.

52. The organic electronic device according to claim 48, wherein said conductive metal layer (c) comprises at least one of aluminum, calcium, magnesium, palladium, platinum, silver, gold, mercury, cobalt, copper, nickel, gallium, carbon, or a combination thereof.

53. The organic electronic device according to claim 48, wherein said anode comprises at least one of indium-tin oxide, gold, silver, aluminum, platinum, chromium, palladium, or a combination thereof.

54. The organic electronic device according to claim 48, wherein said organic electronic device further comprises a hole injection layer positioned between said anode and said electro-active organic layer.

55. The organic electronic device according to claim 54, wherein said hole injection layer comprises at least one of poly(3,4-ethylenedioxythiophene), poly(3,4-propylenedioxythiophene), or a combination thereof.

56. The organic electronic device according to claim 48 wherein said electro-active organic layer is an electroluminescent organic layer comprising at least one of poly (n-vinylcarbazole) and its derivatives, polyfluorene and its derivatives, poly(dioctylfluorene) and its derivatives, poly (paraphenylene) and its derivatives; poly(p-phenylene vinylene) and its derivatives, polythiophene and its derivatives; poly(pyridine vinylene) and its derivatives; polyquinoxaline and its derivatives; and poly quinoline and its derivatives, or a combination thereof.

57. The organic electronic device according to claim 48 further comprising an electron injection layer positioned between said electro-active organic layer and said conductive metal layer (c).

* * * * *